(12) United States Patent
Jiang

(10) Patent No.: US 8,906,797 B2
(45) Date of Patent: *Dec. 9, 2014

(54) MICROELECTRONIC FLIP CHIP PACKAGES WITH SOLDER WETTING PADS AND ASSOCIATED METHODS OF MANUFACTURING

(71) Applicant: Monolithic Power Systems, Inc., San Jose, CA (US)

(72) Inventor: Hunt Hang Jiang, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/706,062

(22) Filed: Dec. 5, 2012

(65) Prior Publication Data

US 2014/0004662 A1 Jan. 2, 2014

Related U.S. Application Data

(63) Continuation of application No. 12/970,784, filed on Dec. 16, 2010, now Pat. No. 8,361,899.

(51) Int. Cl.
*H01L 21/44* (2006.01)
*H01L 21/56* (2006.01)
(Continued)

(52) U.S. Cl.
CPC ............... *H01L 21/52* (2013.01); *H01L 24/16* (2013.01); *H01L 2924/01082* (2013.01); *H01L 2224/81439* (2013.01); *H01L 2224/16258* (2013.01); *H01L 2224/81444* (2013.01); *H01L 2224/81815* (2013.01); *H01L 2924/014* (2013.01); *H01L 2224/92125* (2013.01); *H01L 21/563* (2013.01); *H01L 2224/131* (2013.01); *H01L 23/49582* (2013.01); *H01L 2924/01047* (2013.01); *H01L 2924/14* (2013.01); *H01L 23/49572* (2013.01); *H01L 2224/8121* (2013.01); *H01L 2224/13111* (2013.01); *H01L 2924/3841* (2013.01); *H01L 2224/831* (2013.01); *H01L 2224/13116* (2013.01); *H01L 2224/81447* (2013.01); *H01L 23/3107* (2013.01); *H01L 2924/13091* (2013.01); *H01L 2924/01033* (2013.01); *H01L 2924/01005* (2013.01); *H01L 2224/1146* (2013.01);
(Continued)

(58) Field of Classification Search
USPC .................................................. 438/612, 123
See application file for complete search history.

(56) References Cited

U.S. PATENT DOCUMENTS 7,880,313 B2   2/2011   Lee et al.
2007/0003811 A1*  1/2007  Zerfass et al. ................. 429/35
(Continued)

*Primary Examiner* — Timor Karimy
(74) *Attorney, Agent, or Firm* — Perkins Coie LLP

(57) ABSTRACT

Processes of assembling microelectronic packages with lead frames and/or other suitable substrates are described herein. In one embodiment, a method for fabricating a semiconductor assembly includes forming an attachment area and a non-attachment area on a lead finger of a lead frame. The attachment area is more wettable to the solder ball than the non-attachment area during reflow. The method also includes contacting a solder ball carried by a semiconductor die with the attachment area of the lead finger, reflowing the solder ball while the solder ball is in contact with the attachment area of the lead finger, and controllably collapsing the solder ball to establish an electrical connection between the semiconductor die and the lead finger of the lead frame.

12 Claims, 7 Drawing Sheets

(51) Int. Cl.
*H01L 23/495* (2006.01)
*H01L 23/31* (2006.01)
*H01L 21/52* (2006.01)
*H01L 23/00* (2006.01)

(52) U.S. Cl.
CPC ....... *H01L 24/13* (2013.01); *H01L 2924/13055* (2013.01); *H01L 2924/13062* (2013.01); *H01L 2224/11849* (2013.01); *H01L 2924/01006* (2013.01); *H01L 2924/0103* (2013.01); *H01L 2924/01079* (2013.01); *H01L 2224/13118* (2013.01); *H01L 2224/11334* (2013.01); *H01L 2924/0105* (2013.01); *H01L 2224/81455* (2013.01); *H01L 2224/32245* (2013.01); *H01L 23/49548* (2013.01); *H01L 2224/81191* (2013.01); *H01L 24/81* (2013.01); *H01L 24/11* (2013.01); *H01L 2924/01029* (2013.01); *H01L 2224/73204* (2013.01); *H01L 2224/13139* (2013.01); *H01L 2224/13147* (2013.01)
USPC .......................................... 438/612; 438/123

(56) References Cited

U.S. PATENT DOCUMENTS

| | | |
|---|---|---|
| 2009/0166823 A1 | 7/2009 | Do et al. |
| 2011/0140251 A1 | 6/2011 | Camacho et al. |

* cited by examiner

MICROELECTRONIC FLIP CHIP PACKAGES WITH SOLDER WETTING PADS AND ASSOCIATED METHODS OF MANUFACTURING

RELATED APPLICATION

This application is a continuation of U.S. patent application Ser. No. 12/970,784 filed Dec. 16, 2010, now allowed.

TECHNICAL FIELD

The present technology is directed to microelectronic flip chip packages with solder wetting pads and associated methods of manufacturing.

BACKGROUND

Flip chip is a method for directly interconnecting semiconductor dies and a substrate with solder balls (or solder bumps). During assembly, solder balls are first deposited onto a semiconductor die. A solder mask is formed on the substrate (e.g., a printed circuit board) to define a plurality of connection sites. The semiconductor die with the solder balls is then flipped over to align the solder balls with corresponding connection sites on the substrate. The solder balls are then reflowed to complete the interconnection.

One drawback of the foregoing flip chip technique is that the solder balls tend to uncontrollably collapse during reflow when the substrate is a lead frame having a plurality of lead fingers. The collapsed solder balls may cause various structural, functional, and/or other types of damages to the resulting microelectronic package. For example, adjacent solder balls may come in contact with one another to short circuit the semiconductor die and/or the substrate.

One conventional solution is to form a solder mask on the lead frame as on a printed circuit board. However, forming a solder mask on the small lead fingers is difficult, time consuming, and costly. Accordingly, there is a need for improved flip chip techniques that can at least reduce or eliminate the risk of uncontrollable collapse of solder balls during reflow.

DETAILED DESCRIPTION

Several embodiments of the present technology are described below with reference to processes of assembling microelectronic packages with lead frames and/or other suitable substrates. Typical microelectronic packages include microelectronic circuits or components, thin-film recording heads, data storage elements, microfluidic devices, and other components manufactured on microelectronic substrates. Microelectronic substrates can include semiconductor pieces (e.g., doped silicon wafers or gallium arsenide wafers), non-conductive pieces (e.g., various ceramic substrates), or conductive pieces (e.g., metal or metal alloy). Many of the details regarding certain embodiments are also described below with reference to semiconductor dies. The term "semiconductor die" is used throughout to include a variety of articles of manufacture, including, for example, individual integrated circuit dies, imager dies, sensor dies, and/or dies having other semiconductor features.

Many specific details that relate to certain embodiments are set forth in the following text to provide a thorough understanding of these embodiments. Several other embodiments can have configurations, components, and/or processes that are different from those described below. A person skilled in the relevant art, therefore, will appreciate that additional embodiments may be practiced without several of the details of the embodiments shown in FIGS. 1A-5B.

Figure 1A:
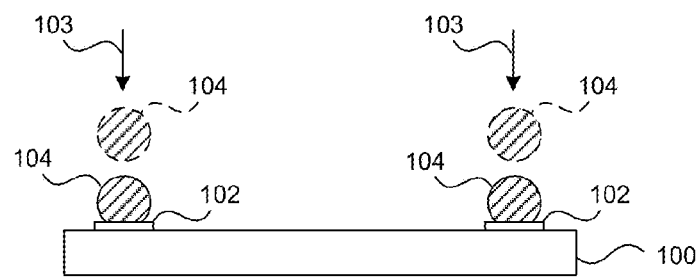
FIGS. 1A-1F are partially schematic, cross-sectional views of a semiconductor die and/or a portion of a lead frame undergoing a process to form a microelectronic package in accordance with embodiments of the technology.

FIGS. 1A-1F are partially schematic, cross-sectional views of a semiconductor die and/or a portion of a lead frame undergoing a process to form a microelectronic package in accordance with embodiments of the technology. As shown in FIG. 1A, an initial stage of the process can include attaching a plurality of electrical couplers 104 to ball/bump sites 102 of a semiconductor die 100, as indicated by the arrows 103. The electrical couplers 104 prior to attachment and/or plating are shown in phantom lines for clarity. In the illustrated embodiment, two electrical couplers 104 are shown for illustration purposes. In other embodiments, one, three, or any other suitable numbers of electrical couplers may be used.

The semiconductor die 100 can include any suitable type of integrated circuit device. For example, in certain embodiments, the semiconductor die 100 can include a plurality of metal-oxide-semiconductor field-effect transistors ("MOSFETs"), junction gate field-effect transistors ("JFETs"), insulated gate bipolar transistors, capacitors, and/or other suitable electrical components. In other examples, the semiconductor die 100 can include other suitable types of electrical and/or mechanical components.

In certain embodiments, the electrical couplers 104 can include solder balls attached to the ball/bump sites 102 using tack welding, partial reflow, and/or other suitable techniques. In other embodiments, the electrical couplers 104 can include solder bumps plated onto and/or otherwise formed on the ball/bump sites 102. As used herein, the term "solder" generally refers to a fusible metal alloy with a melting point in the range of about 90° C. to 450° C. Examples of a solder include alloys of at least some of copper (Cu), tin (Sn), lead (Pb), silver (Ag), zinc (Zn), and/or other suitable metals. In other embodiments, the electrical couplers 104 can also include other suitable electrically conductive couplers.

Figure 1B:
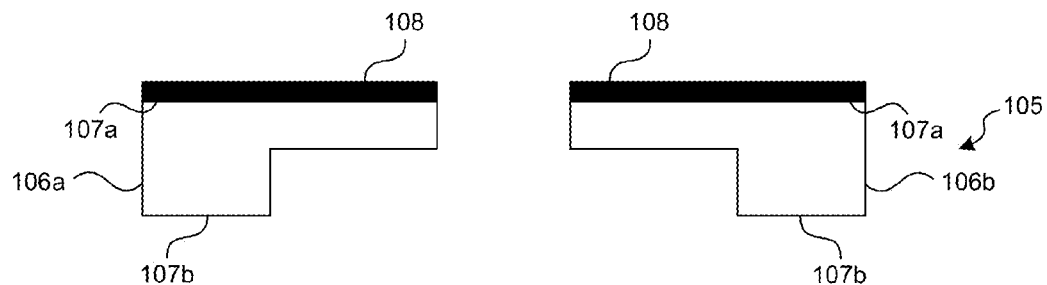
Figure 1C:
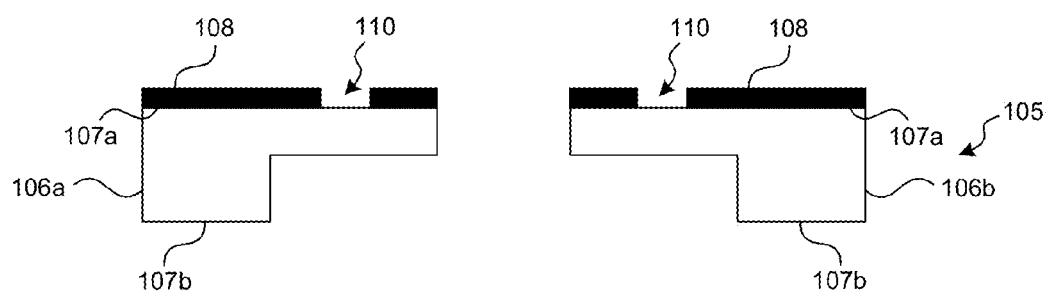
Figure 1D:
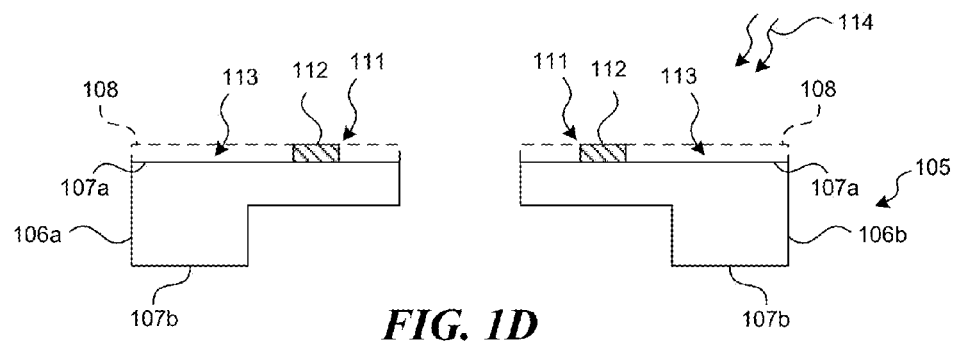

FIGS. 1B-1D illustrate stages of forming an attachment area 112 and a non-attachment area 113 on a lead frame 105 in accordance with embodiments of the technology. As shown in FIGS. 1B-1D, the lead frame 105 can include a plurality of lead fingers 106. In the illustrated embodiment, a first lead finger 106a is shown juxtaposed with a second lead finger 106b for illustration purposes. In other embodiments, the lead frame 105 can also include a die paddle (not shown), a dam bar (not shown), other number of lead fingers, and/or other suitable components. The lead fingers 106 can include a first surface 107a opposite a second surface 107b. As described in more detail later, the first surface 107a may be configured to interface with the semiconductor die 100 (FIG. 1A), and the second surface 107b may be configured to interface with an external device (e.g., a printed circuit board, not shown).

As shown in FIG. 1B, the process includes a deposition stage in which a masking material 108 is formed on the first surface 107a of the lead fingers 106. In one embodiment, the masking material 108 can include a photoresist deposited on the lead fingers 106 via a spin-on operation and/or other suitable techniques. In other embodiments, the photoresist can include a tape of a dry film photoresist that may be laminated onto and/or otherwise attached to the lead fingers 106. As used herein, the term "photoresist" generally refers to a material that can be chemically modified when exposed to electromagnetic radiation. The term encompasses both positive photoresist (i.e., soluble when activated by the electromagnetic radiation) and negative photoresist (i.e., insoluble when activated by the electromagnetic radiation). In other embodiments, the masking material 108 can also include hard rubber and/or other suitable types of "hard" masking materials.

FIG. 1C illustrates a material removal stage of the process, in which a portion of the masking material 108 is removed to form a plurality of openings 110. In one embodiment, the material removal stage can include patterning a photoresist based on a desired configuration using photolithography and/or other suitable techniques. In other embodiments, the openings 110 in the masking material 108 may also be formed using laser ablation, wet etching, dry etching, and/or other suitable techniques.

As shown in FIG. 1D, another stage of the process includes forming the attachment area 112 and the non-attachment area 113 on the first surface 107a of the lead fingers 106. In the illustrated embodiment, forming the attachment area 112 (or solder wetting pads) includes depositing a wetting material 111 into the openings 110 of the masking material 108. The wetting material 111 can include silver (Ag), a nickel (Ni)/gold (Au) alloy, and/or other suitable metal or metal alloys that exhibit first wetting characteristics with regard to the electrical couplers 104 (FIG. 1A) during reflow. As used herein, wetting characteristics are represented by a wetting contact angle. For example, in certain embodiments, the wetting contact angle between the wetting material 111 and the electrical couplers 104 during reflow can be less than about 90°, indicating generally wettable characteristics. In other embodiments, the wetting contact angle can be less than about 60°, about 45°, about 30°, and/or other suitable values.

After forming the attachment area 112, the process can include removing the masking material 108 (shown in phantom lines for clarity) and any excess wetting material 111. Subsequently, the exposed portions of the first surface 107a can be treated to form the non-attachment area 113 that has second wetting characteristics. In one embodiment, the exposed portions of the first surface 107a may be oxidized by contacting an oxidizing chemical solution (e.g., sulfuric acid, nitric acid, hydrochloric acid, and/or a combination thereof), heating the lead fingers 106 in air, by contacting with oxygen plasma, and/or by using other suitable techniques. In other embodiments, the exposed portions of the first surface 107a may be treated using other suitable surface treatment techniques.

After surface treatment, the non-attachment area 113 can be generally non-wettable to the electrical couplers 104 (FIG. 1A) during reflow. For example, in one embodiment, a contact angle between the non-attachment area 113 and the electrical couplers 104 during reflow can be greater than about 90°, indicating generally non-wettable characteristics. In other examples, the non-wetting contact angle can be greater than about 120°, about 135°, and/or other suitable values.

Figure 1E:
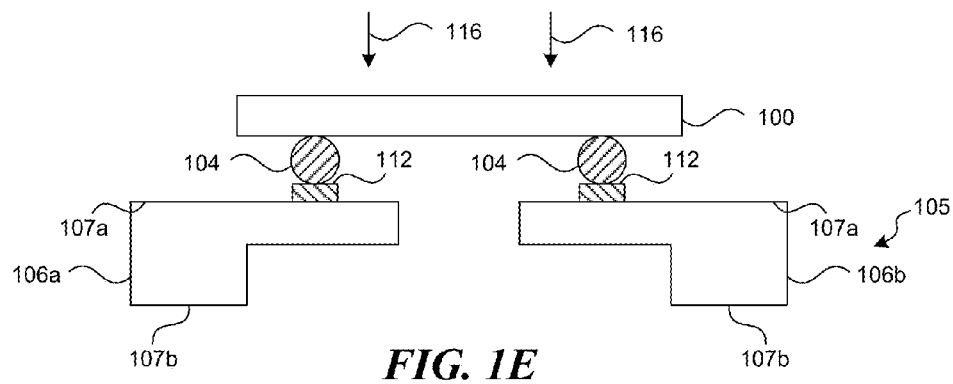

FIG. 1E illustrates another stage of the process in which the semiconductor die 100 is attached to the lead frame 105 with the electrical couplers 104 generally aligned and in contact with the attachment area 112 of the lead fingers 106. The lead frame 105 with the attached semiconductor die 100 can then be reflowed, for example, in a reflow chamber (not shown), and heat (as represented by the arrows 116) and/or other suitable forms of energy can be applied. As a result, the electrical couplers 104 can be at least partially melted in order to join the lead frame 105 and the semiconductor die 100 together when subsequently cooled.

It has been observed that the lead fingers 106 with the attachment area 112 and the non-attachment area 113 can enable a controllable collapse of the electrical couplers 104 during the reflow operation without using a solder mask. As a result, the risk of various structural and/or electrical damages to the resulting microelectronic package may be reduced and/or avoided. As discussed above, the attachment area 112 is generally wettable while the non-attachment area 113 is generally non-wettable to the electrical couplers 104. Without being bound by theory, it is believed that the wettability differential between the attachment area 112 and the non-attachment area 113 can at least limit or substantially eliminate migration or spreading of the reflowed electrical couplers 104. It is believed that the reflowed electrical couplers 104 may not readily bond to the non-attachment area 113 due to a lack of surface contact. As a result, the reflowed electrical couplers 104 tend to be confined in the attachment area 112.

In certain embodiments, a wettability differential between the attachment area 112 and the non-attachment area 113 may be adjusted based on a target degree of migration of the reflowed electrical couplers 104. In general, it is believed that the larger the wettability differential, the smaller the degree of migration, and vice versa. Thus, if a small degree of migration is desired, a large wettability differential (e.g., a contact angle difference of greater than about 20°, about 30°, or about 40°) may be used. If a large degree of migration may be tolerated, a small wettability differential (e.g., a contact angle difference of less than about 15°, about 10°, or about 5°) may be used.

Figure 1F:
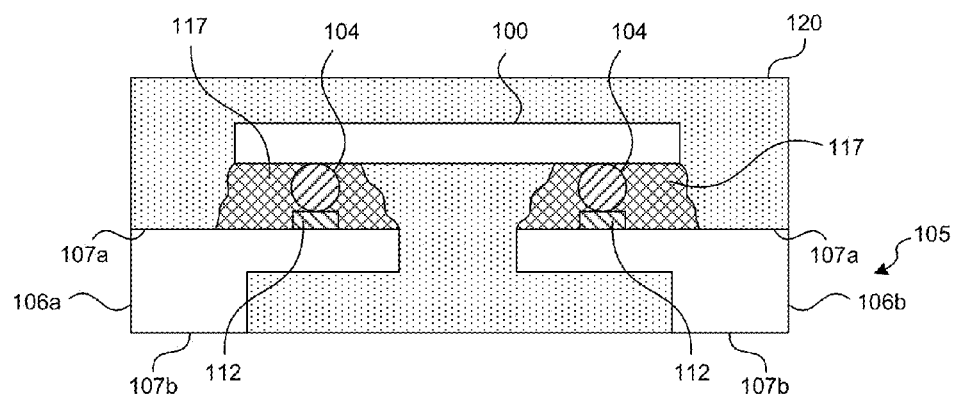

Subsequent to reflow, the process can also include various additional processing stages. For example, as shown in FIG. 1F, an underfill material 117 may be deposited between the semiconductor die 100 and the lead fingers 106. The underfill material 117 may at least partially encapsulate the electrical couplers 104. In other embodiments, the underfill material 117 may be omitted.

The semiconductor die 100 and the lead frame 105 can also be encapsulated by an encapsulant 120 (e.g., an epoxy or other types of molding compounds). In the illustrated embodiment, the semiconductor die 100 is substantially encapsulated in the encapsulant 120. The lead fingers 106 are partially encapsulated in the encapsulant 120 with the second surfaces 107b exposed for interconnecting to external devices (not shown). In other embodiments, the lead frame 105 may include lead fingers 106 that extend beyond the encapsulant 120. In further embodiments, the semiconductor die 100 and the lead frame 105 may be encapsulated in other suitable configurations.

Even though the foregoing process includes forming the attachment area 112 and the non-attachment area 113 by depositing the wetting material 111 and surface treating the lead fingers 106, in other embodiments, forming the attachment area 112 and the non-attachment area 113 may include other processing operations. For example, FIGS. 2A-2E illustrate another process that does not include depositing a wetting material.

Figure 2A:
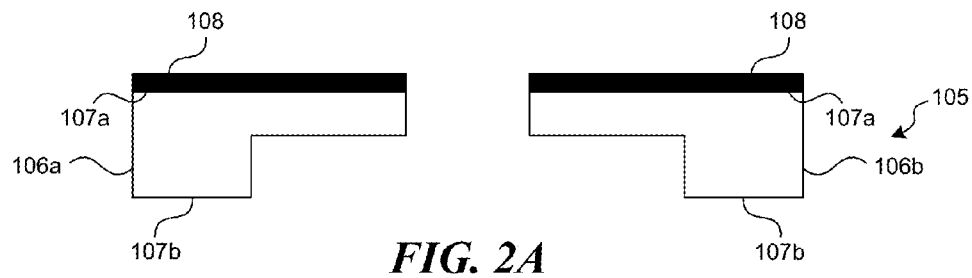
FIGS. 2A-2E are partially schematic, cross-sectional or plan views of a portion of a lead frame undergoing a process in accordance with additional embodiments of the technology.
Figure 2B:
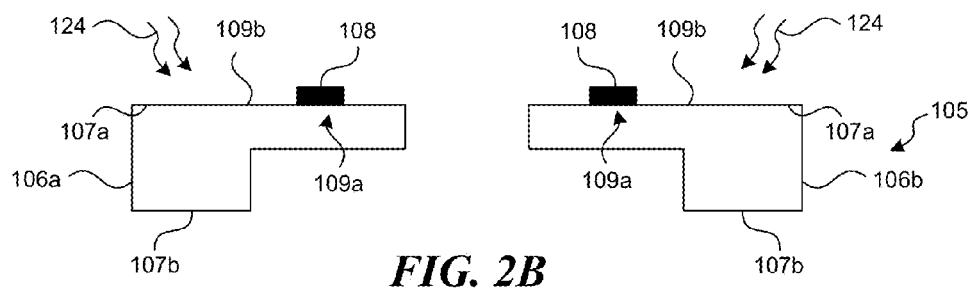
Figure 2C:
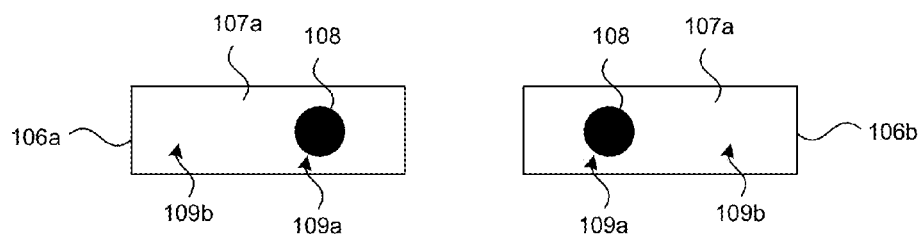

As shown in FIG. 2A, an initial stage of the process can include depositing the masking material 108 on the first surface 107a of the lead fingers 106. As shown in FIGS. 2B and 2C, another stage of the process can include patterning the masking material 108 to define a covered portion 109a and an exposed portion 109b of the first surface 107a of the lead fingers 106. The covered portion 109a generally corresponds to the attachment area 112, and the exposed portion 109b generally corresponds to the non-attachment area 113. In the illustrated embodiment, the covered portion 109a is illustratively shown to have a generally circular shape. In other embodiments, the covered portion 109a may have a rectangular, an oval, a trapezoidal, and/or other suitable shapes.

The exposed portion 109b may then be treated to achieve the target wettability characteristics while the covered portion 109a is protected from the treatment by the remaining masking material 108. In certain embodiments, the exposed portion 109b may be treated in a generally similar manner, as described above with reference to FIG. 1D. In other embodiments, the exposed portion 109b may be treated using other suitable techniques such that the exposed portion 109b is generally non-wettable to the electrical couplers 104 (FIG. 1A) during reflow.

Similar to the process described above with reference to FIGS. 1A-1F, the exposed area 109b of the lead fingers 106 may be treated based on a target wettability differential between the attachment area 112 and the non-attachment area 113. For example, in one embodiment, the lead frame 105 can include copper (Cu) lead fingers 106. As a result, the wettability of the reflowed electric coupler 104 (FIG. 1A) to the copper lead fingers 106 may be readily determined. Thus, a target wettability for the non-attachment area 113 may be derived based on the wettability of the reflowed electric coupler 104 (FIG. 1A) to the copper lead fingers 106 and the target wettability differential. Based on the target wettability for the non-attachment area 113, suitable techniques and/or operation parameters may be selected (e.g., oxygen plasma treatment, heating, etc.) to achieve the target wettability for the non-attachment area 113.

Figure 2D:
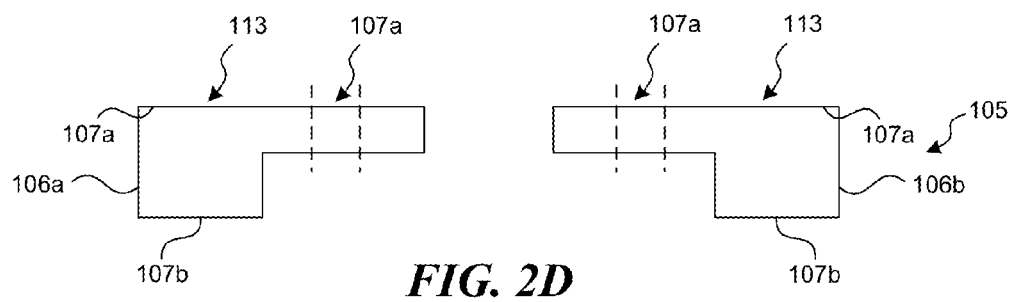
Figure 2E:
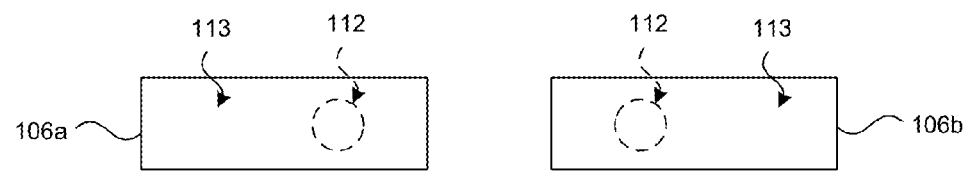

As shown in FIGS. 2D and 2E, another stage of the process can include removing the remaining masking material 108 (FIGS. 2B and 2C) to expose the attachment area 112. Subsequently, the lead frame 105 can undergo other suitable processing stages to form the microelectronic package, as described in more detail with reference to FIGS. 1E and 1F.

Figure 3A:
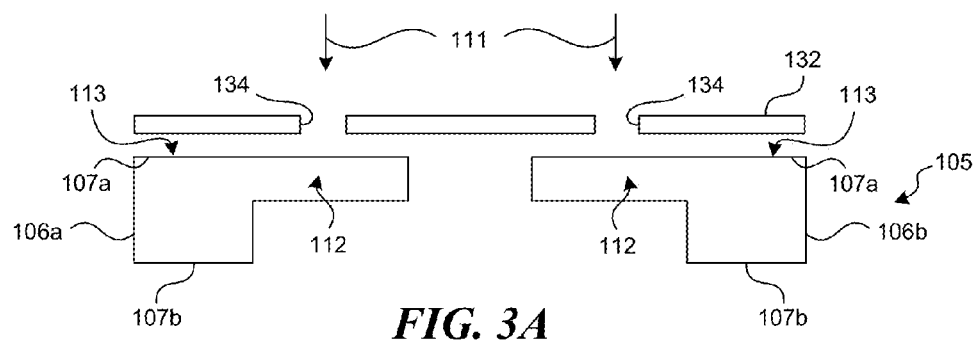
FIGS. 3A-3C are partially schematic and cross-sectional views of a portion of a lead frame undergoing a process in accordance with further embodiments of the technology.
Figure 3B:
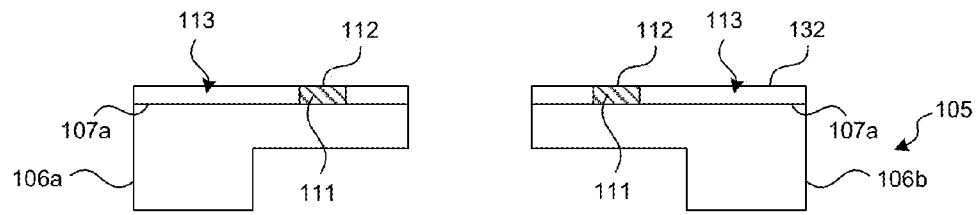
Figure 3C:
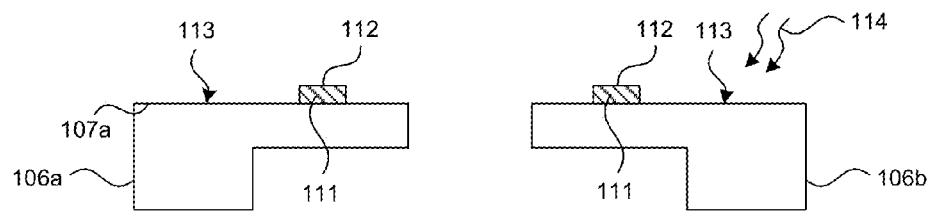

FIGS. 3A-3C illustrate another process of forming the attachment area 112 and the non-attachment area 113 using screen printing. As shown in FIG. 3A, an initial stage of the process can include placing a stencil 132 proximate the lead fingers 106. The stencil 132 can include apertures 134 generally corresponding to the attachment area 112. Subsequently, as shown in FIG. 3B, the wetting material 111 (represented by the arrows 111 in FIG. 3A) may be sprayed, printed, and/or otherwise formed on the first surface 107a of the lead fingers 106 through the apertures 134 of the stencil 132.

As shown in FIG. 3C, the process can then include removing the stencil 132 (FIG. 3B) from the first surface 107a of the lead fingers 106. The exposed portion of the first surface 107a may then optionally undergo surface treatment, as described above with reference to FIG. 1D. Subsequently, the lead frame 105 can undergo other suitable processing stages to form the microelectronic package, as described in more detail with reference to FIGS. 1E and 1F.

Figure 4A:
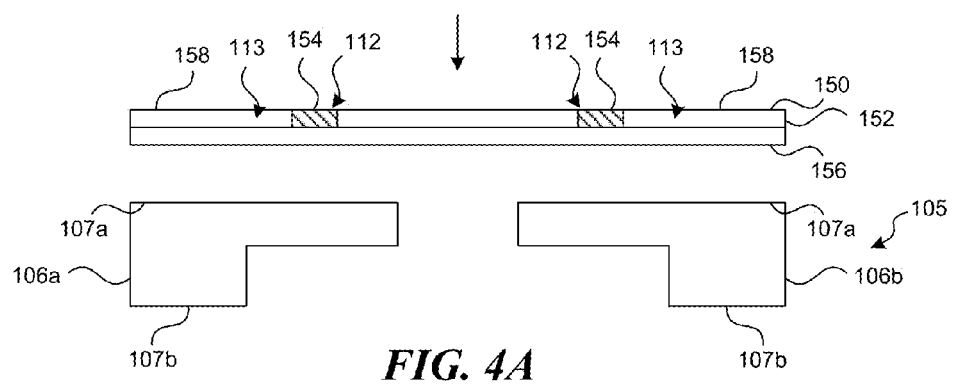
FIGS. 4A and 4B are partially schematic, cross-sectional views of a portion of a lead frame undergoing a process in accordance with yet additional embodiments of the technology.
Figure 4B:
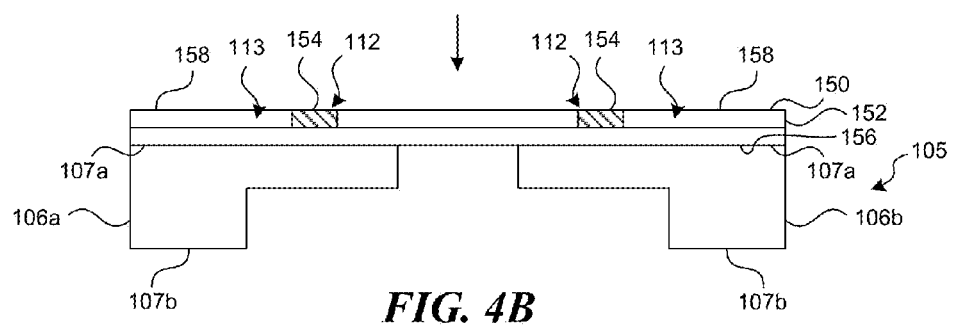

FIGS. 4A and 4B illustrate another process for forming the attachment area 112 and the non-attachment area 113 using a preform. As shown in FIG. 4A, the process can include attaching a preform 150 to the first surface 107a of the lead fingers 106. In the illustrated embodiment, the preform 150 includes a laminated structure with an interface layer 152 and an adhesive layer 156. The interface layer 152 can include a first portion 154 that is wettable to the reflowed electrical couplers 104 (FIG. 1A) and a second portion 158 that is generally non-wettable to the reflowed electrical couplers 104. For example, the first portion 154 can include silver (Ag), and the second portion 158 can include copper oxide ($Cu_xO$). As a result, the first portion 154 and the second portion 158 generally correspond to the attachment area 112 and the non-attachment area 113.

As shown in FIG. 4B, the lead frame 105 with the attached preform 150 may then be optionally cured and/or undergo other suitable processing before being attached to the semiconductor die 100, as described in more detail with reference to FIGS. 1E and 1F. Even though the preform 150 is shown in FIGS. 4A and 4B as having the adhesive layer 156 pre-attached, in other embodiments, the preform 150 may include the interface layer 152 carried by an optional backing layer (not shown) without the adhesive layer 156. Instead, an adhesive (not shown) may be applied to at least one of the preform 150 and the lead frame 105 before attachment thereof.

Figure 5A:
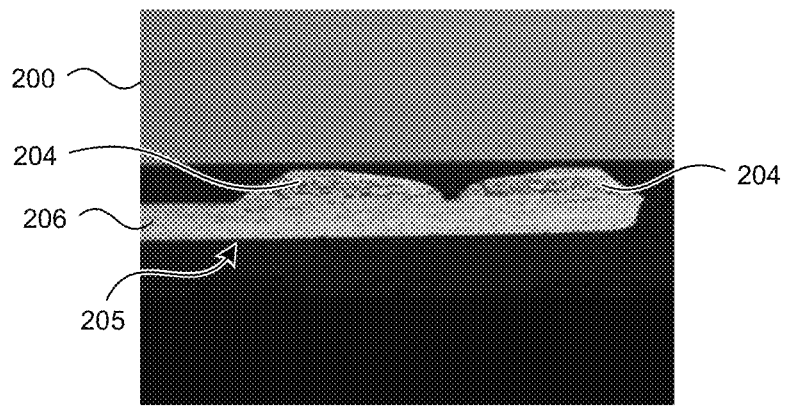
FIGS. 5A and 5B are cross-sectional images of chip-on-lead packages taken during experiments in accordance with several embodiments of the technology.
Figure 5B:
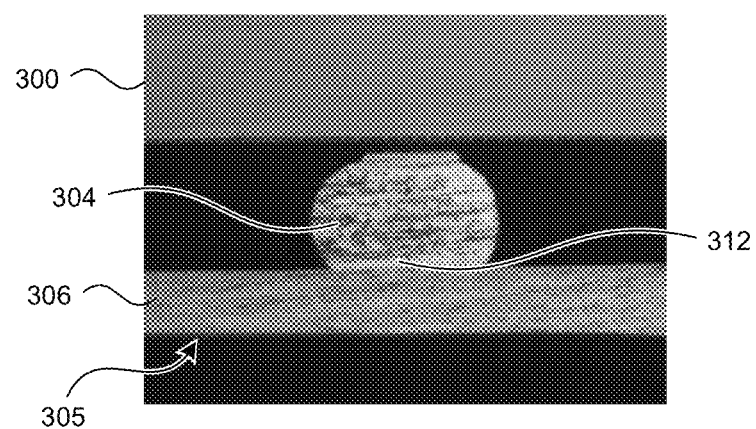

Experiments of assembling chip-on-lead packages were conducted. FIGS. 5A and 5B are cross-sectional images of chip-on-lead packages taken during such experiments. In a first experiment, a semiconductor die 200 with attached solder balls 204 was placed in contact with a lead frame 205 with copper lead fingers 206 that have generally the same regional wettability. The semiconductor die 200 and the lead frame 205 were subsequently reflowed. As clearly shown in FIG. 5A, the solder balls 206 uncontrollably collapsed during reflow and came in contact with each other.

In a second experiment, a semiconductor die 300 with an attached solder ball 304 was placed in contact with a lead frame 305 with a lead finger 306 processed according to several embodiments of the process described above with reference to FIGS. 1A-1E. The lead finger 306 included a contact pad 312 containing silver (Ag) on a portion of the top surface of the lead finger 306. The semiconductor die 300 and the lead frame 305 were subsequently reflowed. As clearly shown in FIG. 5B, the solder ball 304 substantially retained its shape and did not significantly migrate away from the contact pad 312.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

I claim:

1. A method for fabricating a semiconductor assembly, comprising:

forming an attachment area and a non-attachment area on a lead finger of a lead frame, the attachment area being more wettable to a solder ball than the non-attachment area during reflow, and wherein the attachment area having an area comprising silver, and the non-attachment area having an area comprising copper oxide;

contacting a solder ball carried by a semiconductor die with the attachment area of the lead finger;

reflowing the solder ball while the solder ball is in contact with the attachment area of the lead finger; and controllably collapsing the solder ball to establish an electrical connection between the semiconductor die and the lead finger of the lead frame;

and wherein controllably collapsing includes:

preventing the solder ball from migrating away from the silver the attachment area into the copper oxide area of the non-attachment area.

2. The method of claim 1 further comprising:

attaching the solder ball to a contact pad of the semiconductor die;

forming the attachment area and the non-attachment area includes:

depositing a photoresist on a surface of the lead finger containing copper (Cu);

patterning the photoresist to form an opening corresponding to the attachment area, the opening exposing a first portion of the surface of the lead finger, a second portion of the surface being covered by the photoresist;

depositing silver (Ag) on the first portion of the surface of the lead finger through the opening in the photoresist;

removing the photoresist from the second portion of the surface of the lead finger having the deposited silver; and oxidizing the second portion of the surface of the lead finger thereby forming copper oxide ($Cu_xO$).

3. The method of claim 1, further comprising:

attaching the solder ball to a contact pad of the semiconductor die prior to contacting the solder ball with the attachment area of the lead finger; and at least partially encapsulating the semiconductor die, the solder ball, and the lead finger with an encapsulant.

4. The method of claim 1 wherein forming the attachment area and the non-attachment area includes:

depositing a masking material on a surface of the lead finger;

patterning the masking material to form an opening corresponding to the attachment area, the opening exposing a first portion of the surface of the lead finger, wherein a second portion of the surface is covered by the masking material;

depositing a wetting material on the first portion of the surface of the lead finger through the opening in the masking material;

removing the masking material from the surface of the lead finger; and treating the second portion of the surface of the lead finger such that the second portion is less wettable to the solder ball during reflow than the first portion.

5. The method of claim 1 wherein forming the attachment area and the non-attachment area includes:

depositing a photoresist on a surface of the lead finger containing copper (Cu);

patterning the photoresist to form an opening corresponding to the attachment area, the opening exposing a first portion of the surface of the lead finger, wherein a second portion of the surface is covered by the photoresist;

depositing silver (Ag) on the first portion of the surface of the lead finger through the opening in the photoresist;

removing the photoresist from the second portion of the surface of the lead finger; and oxidizing the second portion of the surface of the lead finger thereby forming copper oxide ($Cu_xO$).

6. The method of claim 1 wherein forming the attachment area and the non-attachment area includes:

depositing a wetting material on a first portion of the lead finger; and treating a second portion of the lead finger such that the second portion is less wettable to the solder ball during reflow than the first portion.

7. The method of claim 1 wherein forming the attachment area and the non-attachment area includes:

depositing a masking material on a surface of the lead finger;

removing a portion of the masking material, a remaining portion of the masking material covering a first portion of the surface of the lead finger, wherein a second portion of the surface of the lead finger is exposed through the masking material;

treating the second portion of the surface of the lead finger such that the second portion is less wettable to the solder ball during reflow than the first portion; and thereafter, removing the remaining portion of the masking material from the lead finger.

8. The method of claim 7 wherein treating the second portion includes oxidizing the second portion of the surface of the lead finger.

9. The method of claim 1 wherein forming the attachment area and the non-attachment area includes:

placing a stencil proximate to a surface of the lead finger, the stencil having an opening generally corresponding to the attachment area; and printing a wetting material onto the surface of the lead finger through the opening in the stencil.

10. The method of claim 1 wherein forming the attachment area and the non-attachment area includes attaching a preform onto the lead finger with an adhesive, the preform having a first portion generally corresponding to the attachment area and a second portion generally corresponding to the non-attachment area.

11. The method of claim 1 wherein controllably collapsing includes preventing the solder ball from migrating away from the attachment area with the non-attachment area.

12. A method for fabricating a semiconductor assembly, comprising:

forming an attachment area and a non-attachment area on a lead finger of a lead frame;

contacting a solder ball carried by a semiconductor die with the attachment area of the lead finger;

reflowing the solder ball while the solder ball is in contact with the attachment area of the lead finger; and preventing the solder ball from migrating away from the attachment area toward the non-attachment area; and wherein:

the attachment area has a first wettability to the solder ball during reflow;

the non-attachment area has a second wettability to the solder ball during reflow; and preventing the solder ball from migrating includes treating at least one of the attachment area and the non-attachment area such that the first wettability is less than the second wettability for a target amount; and the method further includes determining the target amount based on a target degree of migration of the solder ball from the attachment area during reflow; and preventing the solder ball from migrating includes at least one of (a) depositing silver (Ag) onto a first portion of the lead finger and (b) oxidizing a second portion of the lead finger.

* * * * *